US011876511B2

(12) United States Patent
Chuang et al.

(10) Patent No.: US 11,876,511 B2
(45) Date of Patent: Jan. 16, 2024

(54) GATE DRIVE APPARATUS CONTROL METHOD

(71) Applicant: Diodes Incorporated, Plano, TX (US)

(72) Inventors: Chiao-Shun Chuang, Kaohsiung (TW); Ta-Chuan Kuo, New Taipei (TW); Ke-Horng Chen, HsinChu (TW)

(73) Assignee: Diodes Incorporated, Plano, TX (US)

( * ) Notice: Subject to any disclaimer, the term of this patent is extended or adjusted under 35 U.S.C. 154(b) by 118 days.

(21) Appl. No.: 17/370,054

(22) Filed: Jul. 8, 2021

(65) Prior Publication Data

US 2021/0336618 A1    Oct. 28, 2021

Related U.S. Application Data

(63) Continuation of application No. 16/895,045, filed on Jun. 8, 2020, now Pat. No. 11,101,796.

(60) Provisional application No. 62/979,880, filed on Feb. 21, 2020, provisional application No. 62/957,497, filed on Jan. 6, 2020.

(51) Int. Cl.
*H03K 17/693* (2006.01)
*H03K 17/687* (2006.01)

(52) U.S. Cl.
CPC ... *H03K 17/693* (2013.01); *H03K 2017/6875* (2013.01); *H03K 2217/0063* (2013.01); *H03K 2217/0081* (2013.01)

(58) Field of Classification Search
CPC .................................................... H03K 17/693
USPC ......................................................... 327/408
See application file for complete search history.

(56) References Cited

U.S. PATENT DOCUMENTS

| 5,359,244 A | 10/1994 | Hopkins |
| 5,986,484 A | 11/1999 | Kimata |
| 6,366,142 B1 * | 4/2002 | Yamada ......... H03K 19/018535 |
| | | 327/435 |
| 2010/0283061 A1 * | 11/2010 | Kelley ................. H03K 17/145 |
| | | 257/77 |
| 2017/0163258 A1 | 6/2017 | Kinzer et al. |
| 2017/0222644 A1 | 8/2017 | Kinzer |

(Continued)

FOREIGN PATENT DOCUMENTS

| CN | 101632176 A | 1/2010 |
| CN | 103929162 A | 7/2014 |

(Continued)

OTHER PUBLICATIONS

First Office action and Search Report for Chinese Application No. 202110006732.1, dated May 11, 2023, 6 pages.

(Continued)

*Primary Examiner* — Tomi Skibinski
(74) *Attorney, Agent, or Firm* — AP3 Law Firm PLLC

(57) ABSTRACT

An apparatus includes a capacitive device configured to provide bias power for a high-side switch, a gate drive path having variable resistance connected between the capacitive device and a gate of the high-side switch, wherein the gate drive path having variable resistance is of a first resistance value in response to a turn-on of the high-side switch, and the gate drive path having variable resistance is of a second resistance value in response to a turn-off of the high-side switch, and wherein the second resistance value is greater than the first resistance value, and a control switch connected between the gate of the high-side switch and ground.

20 Claims, 8 Drawing Sheets

(56) References Cited

U.S. PATENT DOCUMENTS

| | | |
|---|---|---|
| 2019/0140637 A1 | 5/2019 | Chen et al. |
| 2019/0238119 A1 | 8/2019 | Chern et al. |
| 2020/0076411 A1 | 3/2020 | Lee et al. |

FOREIGN PATENT DOCUMENTS

| | | |
|---|---|---|
| CN | 104079282 A | 10/2014 |
| CN | 105932657 A | 9/2016 |
| TW | I271685 B | 1/2007 |
| WO | 2015018149 A1 | 2/2015 |

OTHER PUBLICATIONS

Office action and Search Report for Taiwan Patent Application No. 110141399, dated Mar. 17, 2023, 11 pages.

\* cited by examiner

GATE DRIVE APPARATUS CONTROL METHOD

TECHNICAL FIELD

The present invention relates to a gate drive apparatus, and, in particular embodiments, to a gate drive apparatus for an inverter.

BACKGROUND

An inverter includes two switches connected in series between a power source and ground. The switch connected to the power source is commonly known as a high-side switch, and the switch connected to ground is commonly known as a low-side switch. A high-side drive circuit and a low-side drive circuit are employed to control the gates of the high-side switch and the low-side switch respectively. In order to turn on the high-side switch, the high-side drive circuit may need a gate voltage higher than the voltage of the power source. This may be accomplished with a bootstrap capacitor circuit.

Kinzer (U.S. Patent Application 2017/0222644) discloses a GaN gate drive circuit including a bootstrap capacitor configured for driving the high-side switch of the inverter. The bootstrap capacitor is connected to the gate of the high-side switch through a resistor. It also includes a pull-down switch connected between the gate of the high-side switch and ground.

In operation, when a logic high signal is applied to the gate driver, the pull-down switch is turned on. As a result, the gate of the high-side switch is pulled down to ground. The turn-on of the pull-down switch also establishes a leakage current path between the bootstrap capacitor and ground. The leakage current is inversely proportional to the resistance value of the resistor connected to the bootstrap capacitor. When a logic low signal is applied to the gate driver, both the pull-down switch and the low-side switch are turned off. According to the operating principle of the bootstrap capacitor, a higher voltage from the bootstrap capacitor is applied to the gate of the high-side switch through the resistor. The rise time of the gate drive signal of the high-side switch is also inversely proportional to the resistance value of the same resistor.

SUMMARY OF THE INVENTION

The inventors of this invention recognize that the use of a single fixed-value resistor between the bootstrap capacitor and the gate of the high-side switch severely compromises the performance of the inverter device. On the one hand, a large resistance value would be preferred for reducing the leakage current flowing though the resistor, but on the other hand, a small resistance value would be preferred for improving the rise time of the gate drive signal applied to the high-side switch. The design incompatibility between a fast rise time and a reduced leakage current may result in a design contradiction. The inventors have identified this design contradiction and endeavored to solve this design contradiction.

One aspect of the present invention is to include a variable-resistive gate drive path between the bootstrap capacitor and the gate of the high-side switch.

In operation, when a logic high signal is applied to the gate drive circuit, the resistance of the gate drive path is equal to R1. When a logic low signal is applied to the gate drive circuit, the resistance of the gate drive path is equal to R2, which is much smaller than R1. As such, the larger resistance value of R1 helps to reduce the magnitude of the leakage current. On the other hand, the smaller resistance value of R2 helps to improve the rise time of the gate signal applied to the gate of the high-side switch.

In a first implementation of this invention, the gate drive path comprises a depletion mode transistor and a resistor. The depletion mode transistor is implemented with a GaN transistor in a GaN IC chip and the resistor is connected between a gate and a source of the depletion mode transistor.

In response to a logic high signal applied to the gate drive circuit, a leakage current flows through the depletion mode transistor and the resistor. The leakage current is self-limited by pinching off the current through the depletion mode transistor through self-biasing. When the leakage current is equal to the turn-off threshold divided by the value of the resistor, the gate-source voltage of the depletion mode transistor is equal to the turn-off threshold voltage. As a result, the leakage current is clamped. Because the turn-off threshold voltage is considerably lower than the voltage of a charged bootstrap capacitor, the clamped leakage current manifests a much higher equivalent resistance at the current path.

In the first implementation, the leakage current is determined by two parameters, namely the turn-off threshold of the depletion mode transistor, and the resistance value of the resistor. The leakage current may be controlled through selecting an appropriate turn-off threshold voltage. The value of the resistor may be selected based on the principle of improving the rise time of the gate drive signal when a logic low signal is applied to the gate drive circuit.

One advantage of the first implementation of the present disclosure is a simple and reliable gate drive circuit for improving the efficiency and switching performance of an inverter. More particularly, the depletion mode device helps to reduce the leakage current of the gate drive circuit. As a result of having this depletion mode device, it is not necessary to have a large resistive device for reducing the leakage current. A small resistive device may be employed to improve the rise time of the gate drive signal applied to the high-side switch of the inverter, thereby improving the switching performance of the inverter.

In a second implementation of this invention, the gate drive path comprises a controllable switch and a resistor in series with the switch connected between the bootstrap capacitor and the gate of the high-side switch. When a logic high signal is applied to the gate drive circuit, a signal inverter converts the logic high signal into a logic low signal, which turns off the controllable switch. Since the controllable switch is turned off, the resistance of the gate drive path is equal to infinity. No leakage current occurs in the gate drive path. When a logic low signal is applied to the gate driver, the signal inverter converts the logic low signal into a logic high signal, which turns on the controllable switch. Since the controllable switch is turned on, the resistance of the gate drive path is equal to that of the resistor. The rise time of the second implementation can be improved through selecting the resistance value of the resistor connected in series with the controllable switch.

In a third implementation of this invention, the gate drive path comprises a controllable switch and a resistor in parallel with the switch connected between the bootstrap capacitor and the gate of the high-side switch. When a logic high signal is applied to the gate drive circuit, a signal inverter converts the logic high signal into a logic low signal, which turns off the controllable switch. Since the controllable switch is turned off, the resistance of the gate drive path is equal to that of the resistor. The leakage current can be reduced by selecting a large resistor connected in parallel with the controllable switch. When a logic low signal is applied to the gate driver, the signal inverter converts the logic low signal into a logic high signal, which turns on the controllable switch. Since the controllable switch is turned on, the resistance of the gate drive path is equal to zero so sufficient high current can drive the high side switch.

In a fourth implementation of this invention, the gate drive path comprises a controllable switch and a first resistor connected in series, which is further connected in parallel with a second resistor, the combination is connected between the bootstrap capacitor and the gate of the high-side switch. When a logic high signal is applied to the gate drive circuit, a signal inverter converts the logic high signal into a logic low signal, which turns off the controllable switch. Since the controllable switch is turned off, the resistance of the gate drive path is equal to that of the second resistor. The leakage current can be reduced by selecting a large second resistor. When a logic low signal is applied to the gate driver, the signal inverter converts the logic low signal into a logic high signal, which turns on the controllable switch. Since the controllable switch is turned on, the resistance of the gate drive path is equal to the equivalent overall resistance of the first resistor and the second resistor in parallel. The rise time of the fourth implementation can be improved through selecting the resistance values of the first resistor and the second resistor.

BRIEF DESCRIPTION OF THE DRAWINGS

Corresponding numerals and symbols in the different figures generally refer to corresponding parts unless otherwise indicated. The figures are drawn to clearly depicts the relevant aspects of the various embodiments and are not necessarily drawn to scale.

DETAILED DESCRIPTION OF ILLUSTRATIVE EMBODIMENTS

The present invention will be described with respect to preferred embodiments in a specific context, namely a gate drive circuit for driving an inverter. The invention may also be applied, however, to a variety of power conversion systems. Hereinafter, various embodiments will be explained in detail with reference to the accompanying drawings.

Figure 1:
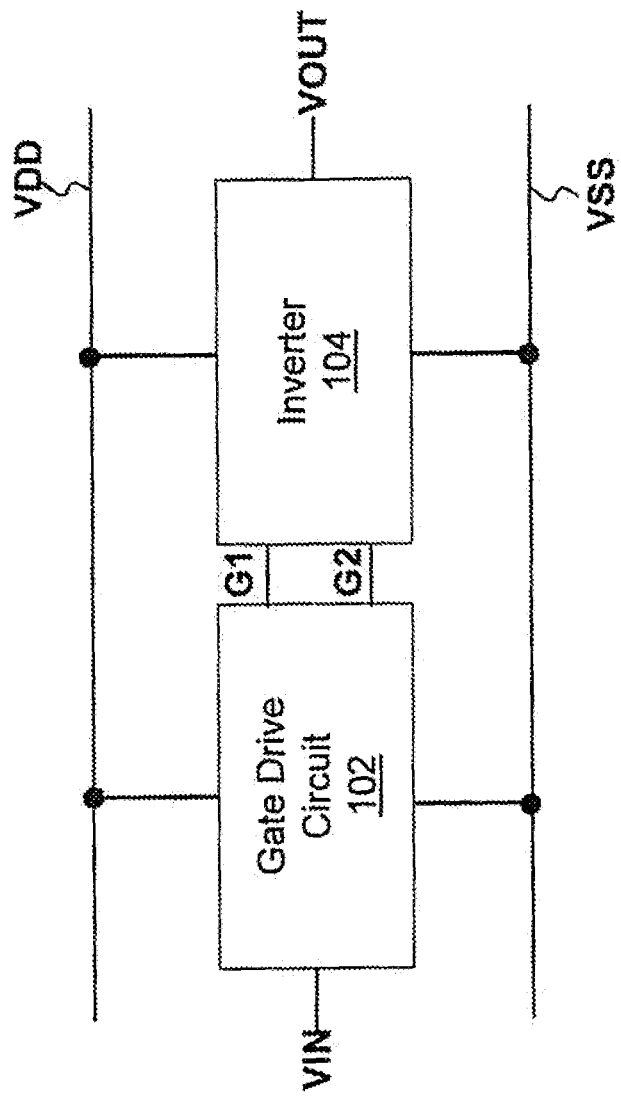
FIG. 1 depicts a block diagram of an inverter and its associated gate drive circuit in accordance with various embodiments of the present invention.

FIG. 1 depicts a block diagram of an inverter and its associated gate drive circuit. An inverter 104 is connected between a first voltage bus VDD and a second voltage bus VSS. The inverter 104 is configured to receive two gate drive signals, namely a first gate drive signal G1 and a second gate drive signal G2. A gate drive circuit 102 is connected between the first voltage bus VDD and the second voltage bus VSS. The gate drive circuit 102 is configured to receive an input signal VIN. The gate drive circuit 102 converts the input signal VIN into the gate drive signals G1 and G2. FIG. 1 depicts the gate drive circuit 102 and the inverter 104 in two separate blocks. However, this embodiment may also be implemented in one IC chip in which both the inverter 104 and the gate drive circuit 102 are contained.

The voltage on the first voltage bus VDD is higher than the voltage on the second voltage bus VSS. In some embodiments, the first voltage bus VDD is connected to a bias power source having an output voltage equal to 5 V. The second voltage bus VSS is connected to ground.

It is appreciated that the voltage of the bias voltage source is merely an example. It may be changed to different values depending on different applications and design needs. For example, in some applications, the voltage on the first voltage bus VDD may be equal to other suitable voltage levels such as 3.3 V. Moreover, the voltage on the first voltage bus VDD may be in a range from about 3.3 V to about 12 V.

The inverter 104 comprises a first switch and a second switch connected in series between the first voltage bus VDD and the second voltage bus VSS. In some embodiments, both the first switch and the second switch are implemented as n-type transistors. The first switch requires a gate drive voltage higher than the voltage on the first voltage bus VDD. The detailed structure of the inverter 104 and the gate drive circuit 102 will be described below in FIG. 2.

The first switch and the second switch of the inverter 104 may be formed by any controllable devices such as gallium nitride (GaN) based power devices, metal oxide semiconductor field effect transistor (MOSFET) devices, bipolar junction transistor (BJT) devices, super junction transistor (SJT) devices, insulated gate bipolar transistor (IGBT) devices, or any combinations thereof and the like.

The gate drive circuit 102 comprises a bootstrap capacitor and a gate drive path linking the bootstrap capacitor and the gate of the first switch of the inverter 104.

In operation, when a logic high signal is applied to the gate drive circuit 102, the second switch is turned on and the first switch is turned off. Under the logic high signal, a leakage current may flow through the gate drive path. The equivalent resistance of the gate drive path is equal to R1. When a logic low signal is applied to the gate drive circuit 102, the second switch is turned off and the first switch is turned on. Under the logic low signal, the equivalent resistance of the gate drive path is equal to R2, which is smaller than R1. As such, the large resistance value of R1 helps to reduce the magnitude of the leakage current flowing through the gate drive path and the small resistance value of R2 helps to improve the rise time of the gate signal applied to the gate of the first switch.

In some embodiments, the gate drive circuit 102 comprises a diode device, a capacitive device, a depletion mode device, a resistive device and a control switch. In some embodiments, the diode device may be implemented as a diode-connected transistor. In other words, the diode-connected transistor is realized through connecting a transistor in a diode configuration. In alternative embodiments, the diode device may be implemented as a p-n junction diode.

In some embodiments, the capacitive device may be implemented as a capacitor-connected transistor. The capacitor-connected transistor is realized through connecting the drain terminal, the source terminal and the bulk terminal of the transistor together. The gate of the transistor is a first terminal of the capacitive device. The drain terminal, the source terminal and the bulk terminal of the transistor are connected together to form the second terminal of the capacitive device. In alternative embodiments, the capacitive device may be implemented as a discrete capacitor. The resistive device may be implemented as a semiconductor resistor. Alternatively, the resistive device may be implemented as a discrete resistor. The control switch may be implemented as an n-type transistor.

The control switch is connected between a gate of the first switch and the second voltage bus VSS. The depletion mode device and the resistive device are connected in series between the first terminal of the capacitive device and the gate of the first switch. The second terminal of the capacitive device is connected to a common node of the first switch and the second switch. The diode device and the capacitive device are connected in series between the first Voltage bus VDD and the common node of the first switch and the second switch.

The depletion mode device and the resistive device form the gate drive path having variable resistance. In some embodiments, the depletion mode transistor may be implemented as a depletion mode GaN transistor.

In operation, the input signal VIN may comprise both a logic high signal and a logic low signal. The inverter 104 converts the logic high signal into a corresponding logic low signal at the output terminal VOUT. Likewise, the inverter 104 converts the logic low signal into a corresponding logic high signal at the output terminal VOUT.

Figure 2:
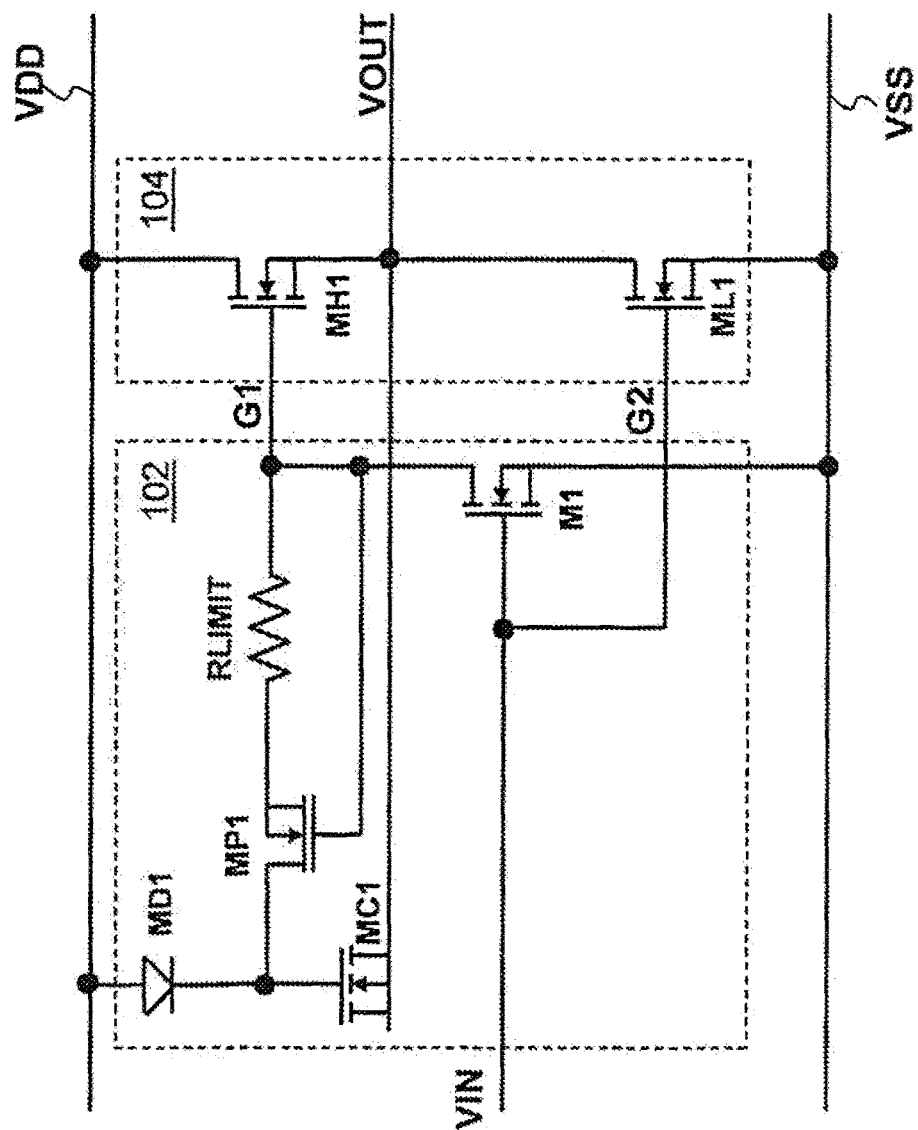
FIG. 2 depicts a schematic diagram of a first implementation of the inverter with the gate drive circuit shown in FIG. 1 in accordance with various embodiments of the present invention.

FIG. 2 depicts a schematic diagram of a first implementation of the inverter and the gate drive circuit shown in FIG. 1. The inverter 104 comprises a first switch MH1 and a second switch ML1 connected in series between the first voltage bus VDD and the second voltage bus VSS. The gate of the first switch MH1 is configured to receive the first gate drive signal G1 generated by the gate drive circuit 102. The gate of the second switch ML1 is configured to receive the second gate drive signal G2 generated by the gate drive circuit 102. The output signal of the inverter 104 is generated at the common node of the first switch MH1 and the second switch ML1. In some embodiments, both the first switch MH1 and the second switch ML1 are implemented as n-type transistors.

The gate drive circuit 102 comprises a diode MD1, a capacitive device MC1, a depletion mode transistor MP1, a resistor RLIMIT and a control switch M1. In some embodiments, the diode MD1 is implemented as a diode-connected transistor. The capacitive device MC1 is implemented as a capacitor-connected transistor. The capacitance value of the capacitor-connected transistor MC1 is in a range from about 100 pF to about 1000 pF. The control switch M1 is implemented as an n-type transistor.

As depicted in FIG. 2, the first terminal of the capacitor-connected transistor MC1 is connected to the first voltage bus VDD through the diode MD1. The anode of the diode MD1 is connected to the first voltage bus VDD. The cathode of the diode MD1 is connected to the first terminal of the capacitor-connected transistor MC1. The second terminal of the capacitor-connected transistor MC1 is connected to the common node of the first switch MH1 and the second switch ML1.

The depletion mode device MP1 and the resistor RLIMIT are connected in series between the first terminal of the capacitive device MC1 and the gate of the first switch MH1. The control switch M1 is connected between the gate of the first switch MH1 and the second voltage bus VSS. The gate of the control switch M1 is connected to VIN and to the gate of the second switch ML1.

In some embodiments, the depletion mode transistor MP1 is implemented as a high electron mobility transistor such as a GaN transistor, which may be integrated with the first switch MH1 and the second switch ML1 and the rest of the components in the gate drive circuit 102 on a single IC chip. In particular, the depletion mode transistor MP1 is a depletion mode GaN transistor. Alternatively, the depletion mode transistor MP1 can be implemented as any suitable depletion mode transistors such as a silicon-based depletion mode transistor.

With respect to the capacitor-connected transistor MC1 as the current source, the inclusion of a depletion mode transistor MP1 in the current path makes the equivalent resistance of the current path a variable one that varies with the state of the input signal VIN and the voltage at the bootstrap capacitor. And it makes the choice of the value for the resistor RLIMIT flexible to optimize the performance of the inverter device.

The resistor RLIMIT may be implemented as a semiconductor resistor. The resistance of the resistor RLIMIT is in a range from about 1 kilo ohms to about 10 kilo ohms or higher. Alternatively, the resistor RLIMIT may be implemented as any suitable resistors such as a discrete resistor. In this embodiment, the resistor RLIMIT value is chosen at 10 kilo-ohms for readily integrating it with the rest of the circuit.

As depicted in FIG. 2, the resistor RLIMIT is connected between the gate and the source of the depletion mode transistor MP1. The inclusion of the depletion transistor helps to modulate the leakage current flowing through the resistor RLIMIT. As current flows through the resistor to VSS, a voltage is generated across the resist and the voltage is applied to the gate of the depletion mode transistor MP1. The negative voltage trends to pinch off the current through the depletion mode transistor MP1. As such, the current flowing through the resistor RLIMIT is limited to a current level equal to the turn-off threshold of the depletion mode transistor MP1 divided by the resistance of the resistor RLIMIT.

In response to a logic high signal VIN applied to the gate drive circuit 102, the control switch M1 and the second switch ML1 are turned on. The capacitive device MC1 is charged dose to voltage of the first voltage bus VDD via the diode MD1.

In addition, a leakage current may flow from the capacitive device MC1 to the second voltage bus VSS through the leakage current path of the depletion mode device MP1, the resistive device RLIMIT and the control switch M1.

For example, for a 5V voltage bus VDD, the bootstrap capacitor is charged to a value of 5V minus a diode drop, which may be assumed to be 1 volt for simplistic illustration. So the capacitor is charged to 4 volts. However, the depletion mode device MP1 and the resistive device RLIMIT are able to control the leakage current flowing through the resistive device RLIMIT that is clamped at the turn-off voltage of MP1 (~1 v) divided by RLIMIT, thereby clamping the power consumption of the gate drive circuit 102 at 100 microamperes. As such, the combination of a 10 kilo-ohm resistor and a depletion transistor has the equivalent resistance of 40 kilo-ohms. Since the depletion mode device MP1 and the resistive device RLIMIT are able to control the leakage current, the resistance value of the resistive device RLIMIT can be lowered to improve the rise time of the gate drive signal of the first switch MH1.

In a conventional inverter such as disclosed in the Kinzer reference, without having the depletion mode transistor MP1, a large resistor such as a 100 kilo-ohm resistor may be necessary for limiting the leakage current within a range (e.g., 100 microampere). With the depletion mode transistor MP1, the resistor RLIMIT can be replaced by a small resistor such as a 10 kilo-ohm resistor. By employing the small resistor, the rise time of the gate drive signal of the first switch MH1 can be reduced from about 16.5 nanoseconds to about 6.58 nanoseconds.

The advantage of improved switch performance is now described. In response to a logic low signal applied to the gate drive circuit 102, both the control switch M1 and the second switch ML1 are turned off. The turn-off of the second switch ML1 configures the capacitive device MC1 as a bootstrap capacitor providing a gate drive voltage exceeding the voltage on the first voltage bus VDD. A gate-driving current is also provided to the gate of the first switch MH1 to raise the gate voltage with respect to the source voltage (VOUT) through the depletion mode device MP1 and the resistive device RLIMIT.

The gate-driving current $I_Q$ is given by the following equation:

$$I_Q = V_{G\_OFF}/RLIMIT \quad (1)$$

where $V_{GS\_OFF}$ is the turn-off voltage of the depletion mode transistor MP1. In some embodiments, $V_{GS\_OFF}$ is in a range from about −0.8 V to about −1 V.

The rise time of the gate drive circuit shown in FIG. 2 can be faster than that of the conventional gate drive circuit that chooses a large resistor to limit the leakage current in the current path. More particularly, when the voltage across the capacitive device MC1 is used to drive the gate of the first switch MH1, the gate drive circuit shown in FIG. 2 can generate a higher gate drive current. During the turn-on of the first switch MH1, the gate-to-source voltage of the first switch MH1 rises from 0 V towards about 5 V and the gate-driving current will be kept at the constant value of 100 micro-amperes until the gate-to-source voltage of the first switch MH1 is approaching the full turn-on voltage. In other words, a constant current of about 100 microamperes is available to charge the gate of the first switch MH1.

In contrast, in a conventional inverter, when the gate-to-source voltage of the first switch MH1 rises from 0 V, the gate drive current is at its maximum value and drops from 100 microamperes for a resistor of 50 kilo-ohms—5 times higher than the exemplary value of 10 kilo-ohms (when the gate-to-source voltage of the first switch MH1 is equal to 0 V) to 20 microamperes (when the gate-to-source voltage of the first switch MH1 is equal to 4 V). In other words, the initial gate drive current of the conventional gate drive circuit is at its peak but after the gate-to-source voltage of the first switch MH1 rises from 0 V, the gate drive current drops accordingly. As such, the gate drive current of the gate drive circuit shown in FIG. 2 is higher than that of the conventional gate drive circuit. In response to this higher gate drive current, the gate drive circuit shown in FIG. 2 is able to achieve a faster rise time, thereby improving the switching performance of the inverter.

Figure 3:
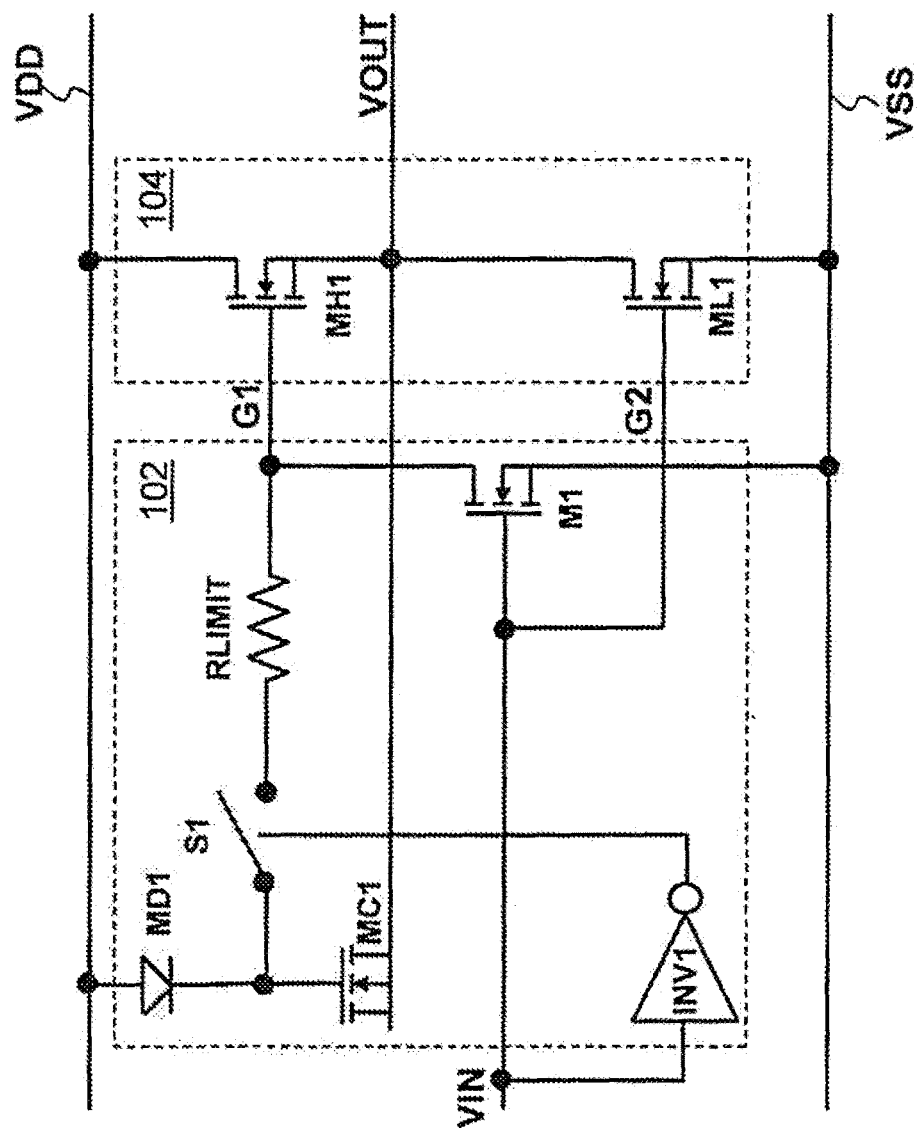
FIG. 3 depicts a schematic diagram of a second implementation of the inverter with the gate drive circuit shown in FIG. 1 in accordance with various embodiments of the present invention.

FIG. 3 depicts a schematic diagram of a second implementation of the inverter and the gate drive circuit shown in FIG. 1 in accordance with various embodiments of the present invention. In the second implementation of the gate drive circuit 102, a controllable switch S1 and a resistor RLIMIT are connected in series to form the gate drive path having two distinct resistance values. The controllable switch S1 may be implemented as any suitable switches such as a MOSFET. An inverter INV1 is employed to control the turn-on and turn-off of the controllable switch S1. As shown in FIG. 3, the input of the inverter INV1 is configured to receive the input signal VIN. The output of the inverter INV1 is used to drive the controllable switch S1.

In operation, when a logic high signal is applied to the gate drive circuit 102, the inverter INV1 converts the logic high signal into a logic low signal, which turns off S1. Since S1 is turned off, the resistance of the gate drive path is equal to infinity. On the other hand, when a logic low signal is applied to the gate drive circuit 102, the inverter INV1 converts the logic low signal into a logic high signal, which turns on S1. Since S1 is turned on, the resistance of the gate drive path is equal to the resistance of RLIMIT. The rise time of the gate drive signal applied to the first switch MH1 can be predetermined by selecting the resistance value of RLIMIT.

Figure 4:
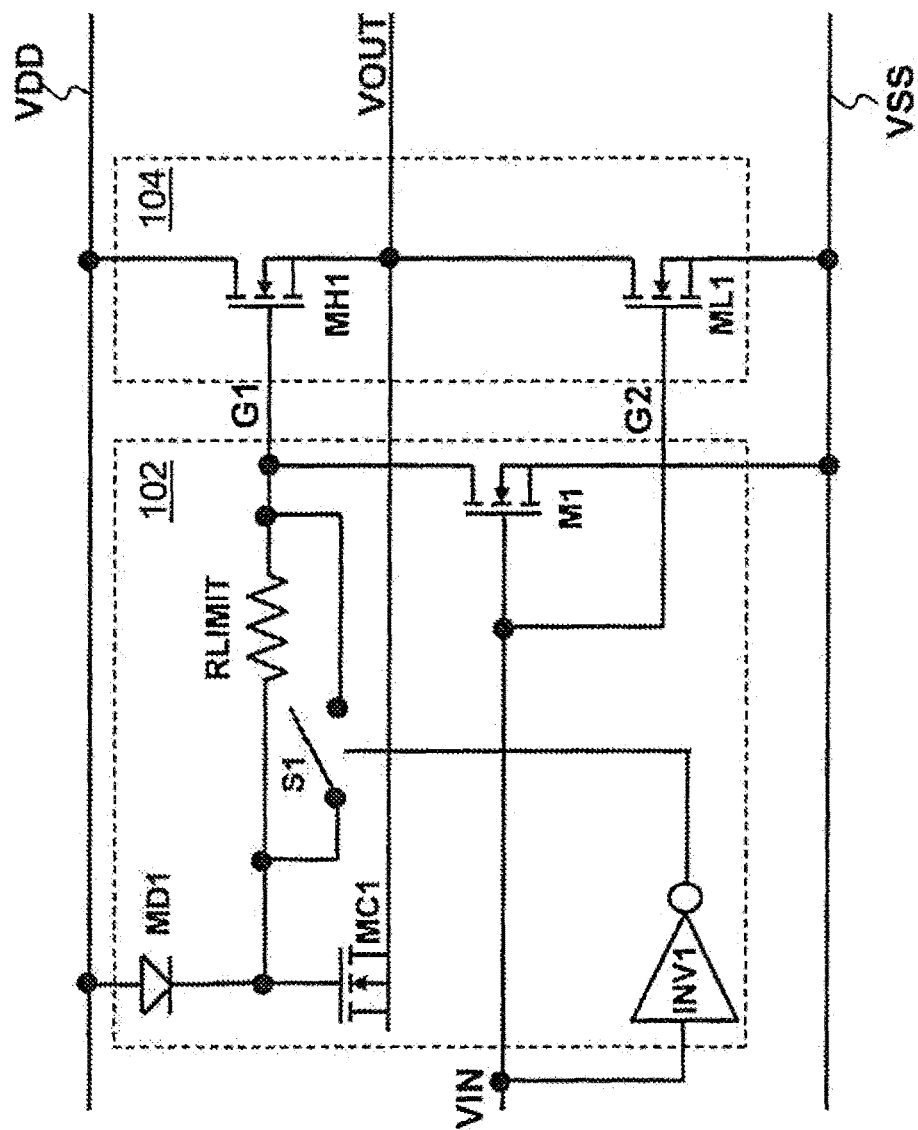
FIG. 4 depicts a schematic diagram of a third implementation of the inverter with the gate drive circuit shown in FIG. 1 in accordance with various embodiments of the present invention.

FIG. 4 depicts a schematic diagram of a third implementation of the inverter and the gate drive circuit shown in FIG. 1 in accordance with various embodiments of the present invention. The third implementation of the gate drive circuit shown in FIG. 4 is similar to that shown in FIG. 3 except that the controllable switch S1 and the resistor RLIMIT are connected in parallel to form the gate drive path having two distinct resistance values.

In operation, when a logic high signal is applied to the gate drive circuit 102, the inverter INV1 converts the logic high signal into a logic low signal, which turns off S1. Since S1 is turned off, the resistance of the gate drive path is equal to the resistance of RLIMIT. The leakage current can be reduced by selecting a large RLIMIT. On the other hand, when a logic low signal is applied to the gate drive circuit 102, the inverter INV1 converts the logic low signal into a logic high signal, which turns on S1. Since S1 is turned on, the resistance of the gate drive path is equal to zero (or almost zero). This low resistance of the gate drive path helps to improve the rise time of the gate drive signal applied to the first switch MH1.

Figure 5:
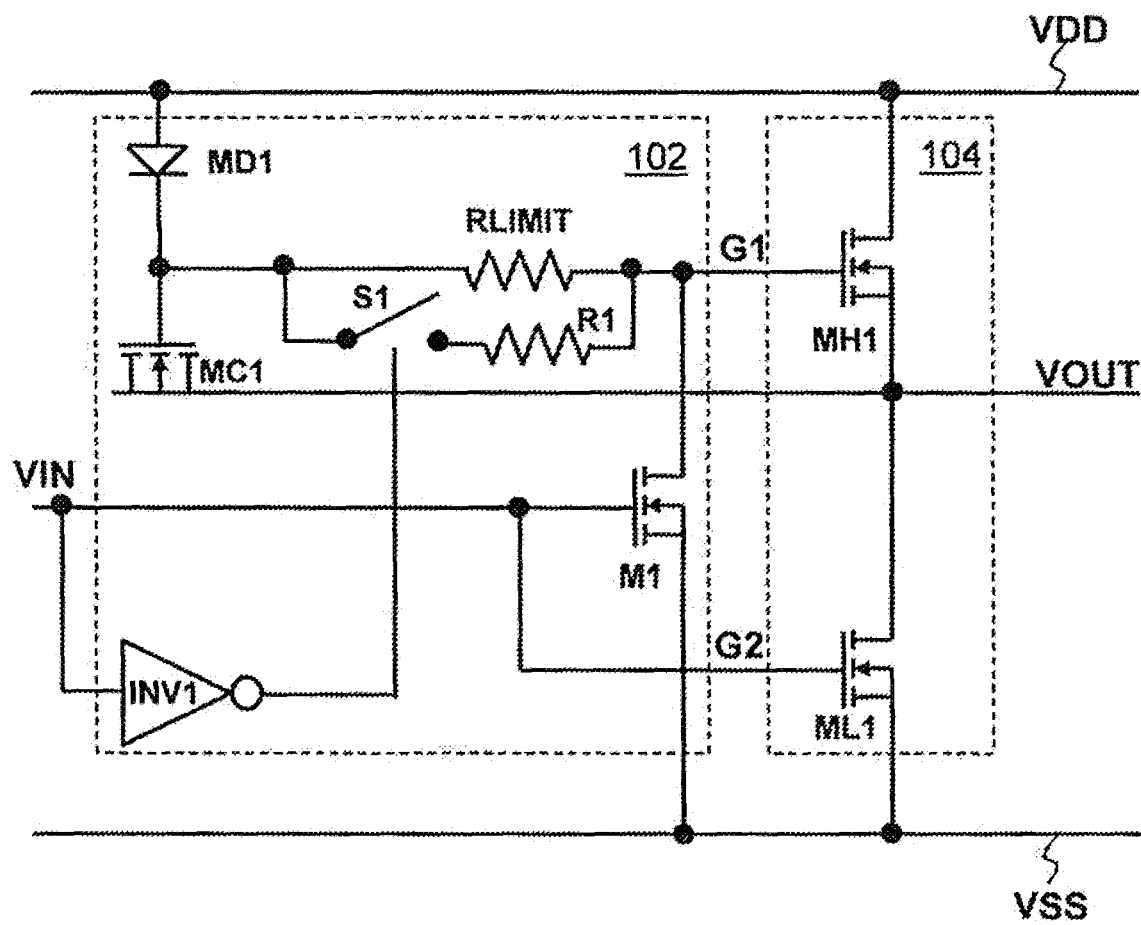
FIG. 5 depicts a schematic diagram of a fourth implementation of the inverter with the gate drive circuit shown in FIG. 1 in accordance with various embodiments of the present invention.

FIG. 5 depicts a schematic diagram of a fourth implementation of the inverter and the gate drive circuit shown in FIG. 1 in accordance with various embodiments of the present invention. The fourth implementation of the gate drive circuit shown in FIG. 5 is similar to that shown in FIG. 4 except that a resistor R1 is connected in series with the controllable switch S1 to form a resistor-switch network. The resistor-switch network is connected in parallel with RLIMIT as shown in FIG. 5.

In operation, when a logic high signal is applied to the gate drive circuit 102, the inverter INV1 converts the logic high signal into a logic low signal, which turns off S1. Since S1 is turned off, the resistance of the gate drive path is equal to the resistance of RLIMIT. The leakage current can be reduced by selecting a large RLIMIT. On the other hand, when a logic low signal is applied to the gate drive circuit 102, the inverter INV1 converts the logic low signal into a logic high signal, which turns on S1. Since S1 is turned on, the resistance of the gate drive path is equal to the equivalent overall resistance of RLIMIT and R1 in parallel.

Figure 6:
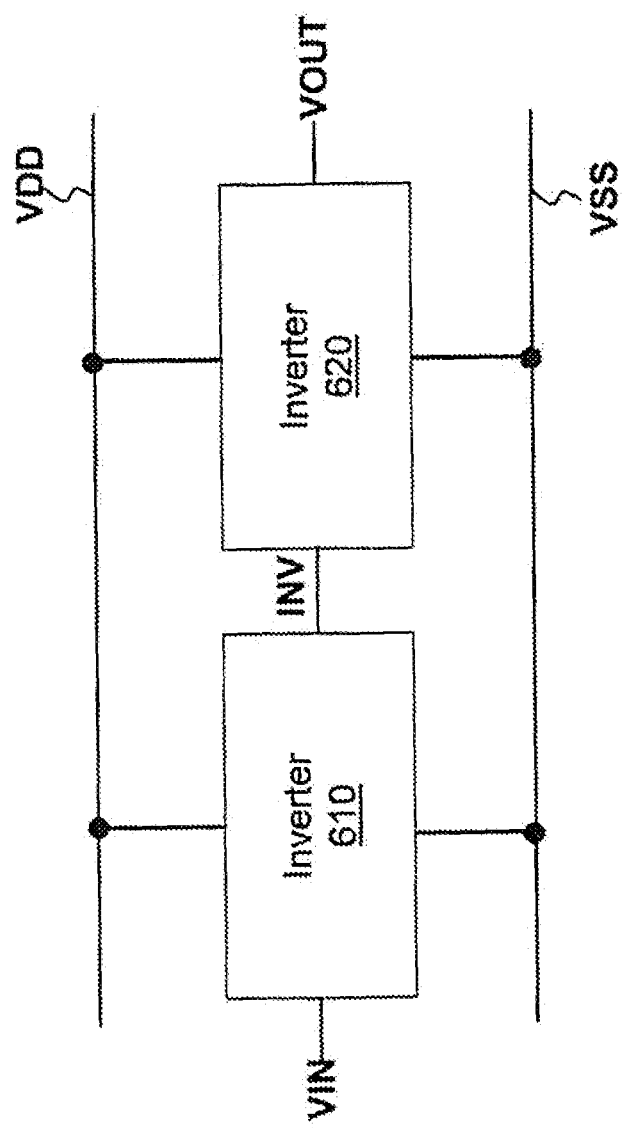
FIG. 6 depicts a block diagram of a system comprising a first inverter and a second inverter connected in cascade in accordance with various embodiments of the present invention.

FIG. 6 depicts a block diagram of a system comprising a first inverter and a second inverter connected in cascade in accordance with various embodiments of the present invention. A first inverter 610 and a second inverter 620 are connected in cascade. The first inverter 610 is connected between the first voltage bus VDD and the second voltage bus VSS. The first inverter 610 is configured to receive the input signal VIN as shown in FIG. 6 and generate an intermediate signal INV fed into the second inverter 620. The detailed structure of the first inverter 610 will be described below with respect to FIG. 7.

The second inverter 620 is connected between the first voltage bus VDD and the second voltage bus VSS. The second inverter 620 is configured to receive the intermediate signal INV as shown in FIG. 6 and generate an output signal VOUT. The detailed structure of the second inverter 620 will be described below with respect to FIG. 8.

It should be recognized that while FIG. 6 depicts the system with two inverters connected in cascade, the system could accommodate any number of inverters. It should further be noted that the inverter shown in FIG. 6 can be implemented as any inverter and its associated gate drive circuit of the present disclosure.

Figure 7:
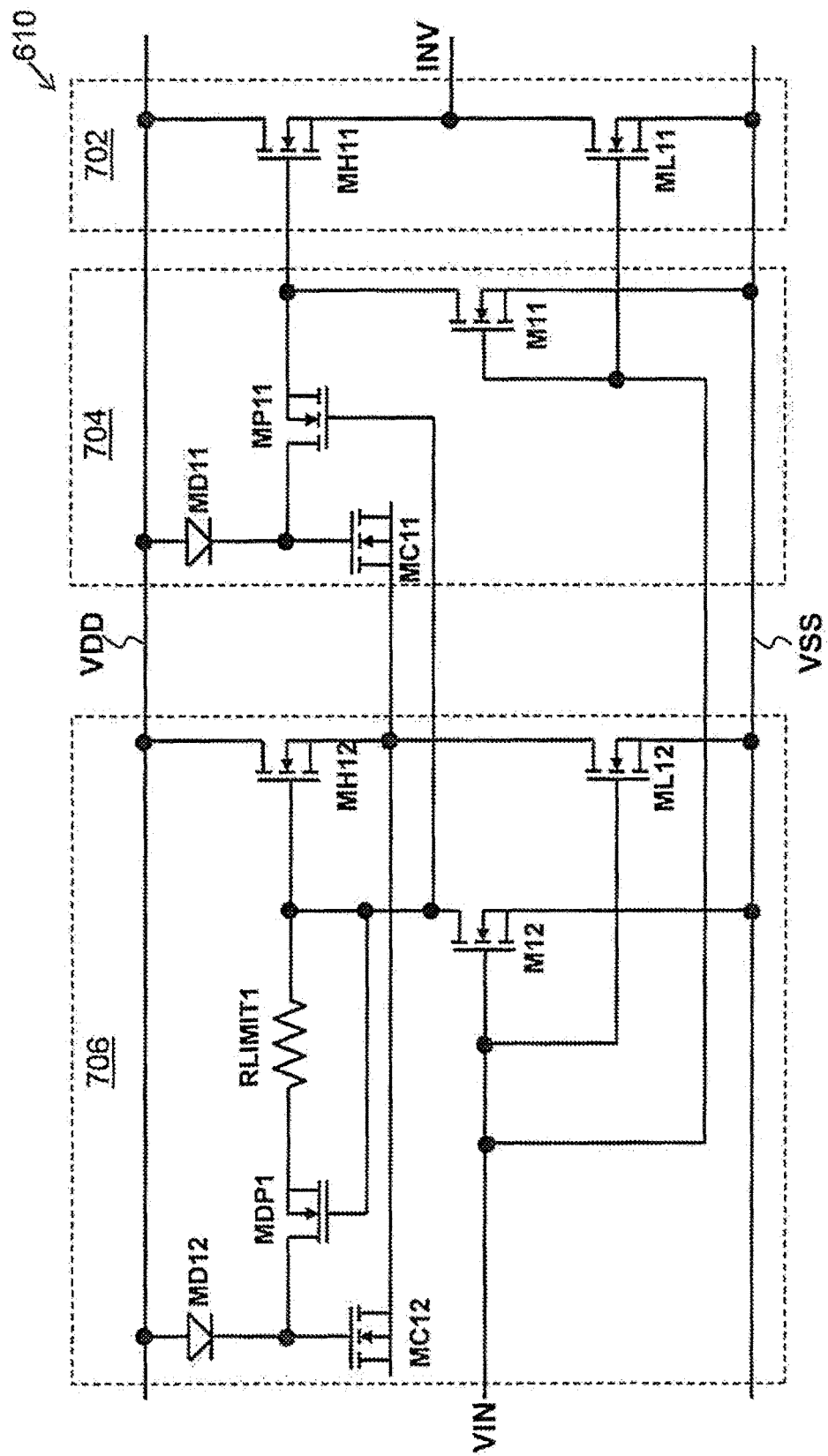
FIG. 7 depicts a schematic diagram of the first inverter shown in FIG. 6 in accordance with various embodiments of the present invention.

FIG. 7 depicts a schematic diagram of the first inverter shown in FIG. 6 in accordance with various embodiments of the present invention. The first inverter 610 comprises an auxiliary drive apparatus 706, a drive apparatus 704 and an inverting circuit 702. The auxiliary drive apparatus 706, the drive apparatus 704 and the inverting circuit 702 are connected between the first voltage bus VDD and the second voltage bus VSS.

The inverting circuit 702 comprises a first switch MH11 and a second switch ML11 connected in series between the first voltage bus VDD and the second voltage bus VSS. The common node of the first switch MH11 and the second switch ML11 is the output terminal of the first inverter 610. As shown in FIG. 7, the inverting circuit 702 is configured to generate the intermediate signal INV. Both the first switch MH11 and the second switch ML11 are implemented as n-type transistors.

The drive apparatus 704 comprises a first diode MD11, a first capacitive device MC11, a first pass transistor MP11 and, a first control switch M11. The first capacitive device MC11 is configured to provide a bias voltage higher than the voltage on the first voltage bus VDD. The first diode MD11 and the first capacitive device MC11 are connected in series. The anode of the first diode MD11 is connected to the first voltage bus VDD. The cathode of the first diode MD11 is connected to the first capacitive device MC11. The first pass switch MP11 is connected between a common node of the first diode MD11 and the first capacitive device MC11, and a gate of the first switch MH11. The first control switch M11 is connected between the gate of the first switch MH11 and the second voltage bus VSS. As shown in FIG. 7, a gate of the first control switch M11 is connected to a gate of the second switch ML11.

The auxiliary drive apparatus 706 comprises a first auxiliary switch MH12, a second auxiliary switch ML12, a second diode MD12, a second capacitive device MC12, a depletion mode device MDP1, a resistive, device RLIMIT1 and a second control switch M12. The depletion mode device MDP1, the resistive device RLIMIT1 and the second control switch M12 form a leakage current path. The first auxiliary switch MH12 and the second auxiliary switch ML12 are connected in series between the first voltage bus VDD and the second voltage bus VSS. The second diode MD12 and the second capacitive device MC12 are connected in series. The second capacitive device MC12 is connected to the common node of the first auxiliary switch MH12 and the second auxiliary switch ML, and further connected to the first capacitive device MC11 as shown in FIG. 7.

The operating principle of the auxiliary drive apparatus 706 is similar to the gate drive circuit 102 shown in FIG. 2. In operation, the second capacitive device MC12 is configured to provide a bias voltage higher than the voltage on the first voltage bus VDD. Such a bias voltage is applied to the gate of first pass transistor MP11 through the depletion mode device MDP1 and the resistive device RLIMIT1. This bias voltage turns on the first pass transistor MP11. Similarly, the first capacitive device MC11 is configured to provide another bias voltage higher than the voltage on the first voltage bus VDD. The bias voltage from the first capacitive device MC11 is applied to the gate of the first switch MH11 through the first pass transistor MP11.

One advantageous feature of having the depletion mode device MDP1 is that the depletion mode device MDP1 helps to reduce the leakage current flowing through the resistive device RLIMIT1, thereby improving the efficiency of the first inverter 610.

Figure 8:
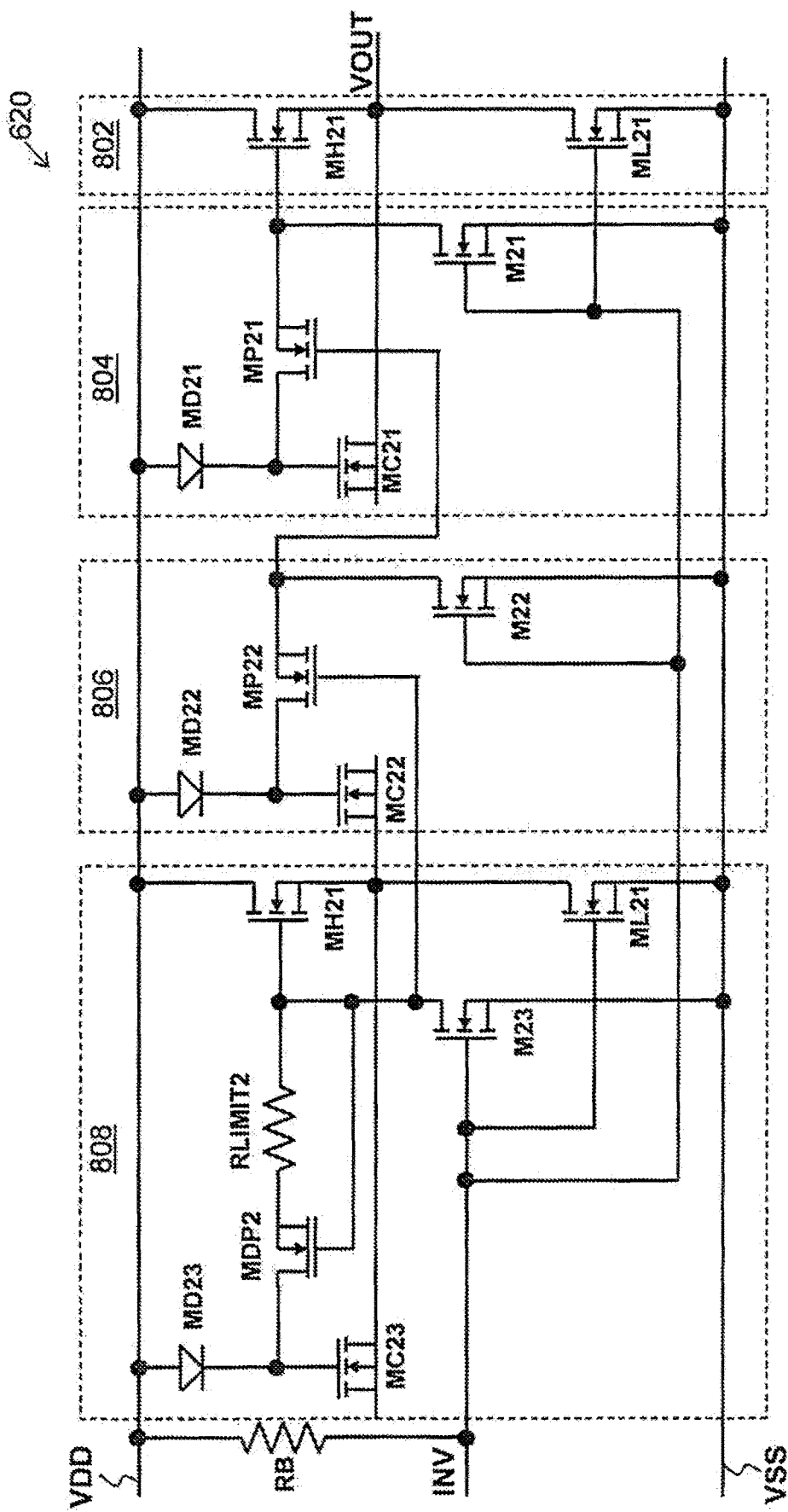
FIG. 8 depicts a schematic diagram of the second inverter shown in FIG. 6 in accordance with various embodiments of the present invention.

FIG. 8 depicts a schematic diagram of the second inverter shown in FIG. 6 in accordance with various embodiments of the present invention. The second inverter 620 comprises an inverting circuit 802, a first drive apparatus 804, a second drive apparatus 806 and an auxiliary drive apparatus 808. The second inverter 620 further comprises a bias resistor RB for pulling up the input signal INV.

The inverting circuit 802 comprises a first switch MH21 and a second switch ML21 connected in series between the first voltage bus VDD and a second voltage bus VSS. The common node of the first switch MH21 and the second switch ML21 is the output terminal of the second inverter 620. Both the first switch MH21 and the second switch ML21 are implemented as n-type transistors.

The first drive apparatus 804 comprises a first capacitive device MC21, a first pass switch MP21, a first diode MD21 and a first control switch M21. The first pass switch MP21 is connected between a first terminal of the first capacitive device MC21 and a gate of the first switch MH21. A second terminal of the first capacitive device MC21 is connected to a common node of the first switch MH21 and the second switch ML21. The first diode MD21 is connected between the first voltage bus VDD and the first terminal of the first capacitive device MC21. The first control switch M21 is connected between the gate of the first switch MH21 and the second voltage bus VSS.

The second drive apparatus 806 comprises a second capacitive device MC22, a second pass switch MP22, a second diode MD22 and a second control switch M22. The second pass switch MP22 is connected between a first terminal of the second capacitive device MC22 and a gate of the first pass switch MP21. The second diode MD22 is connected between the first voltage bus VDD and the first terminal of the second capacitive device MC22. The second control switch M22 is connected between the gate of the first pass switch MP21 and the second voltage bus VSS.

The auxiliary drive apparatus 808 comprises a first auxiliary switch MH21, a second auxiliary switch ML21, a third diode MD23, a third capacitive device MC23, a depletion mode device MDP2, a resistive device RLIMIT2 and a third control switch M23. The depletion mode device MDP2, the resistive device RLIMIT2 and the third control switch M23 form a leakage current path.

The first auxiliary switch MH21 and the second auxiliary switch ML21 are connected in series between the first voltage bus VDD and the second voltage bus VSS. A common node of the first auxiliary switch MH21 and the second auxiliary switch ML21 is connected to the second terminal of the third capacitive device MC23. The third diode MD23 and the third capacitive device MC23 are connected in series between the first voltage bus VDD and the common node of the first auxiliary switch MH21 and the second auxiliary switch ML21. A second terminal of the third capacitive device MC23 is connected to a second terminal of the second capacitive device MC22 as shown in FIG. 8.

In operation, the first drive apparatus 804 is configured to provide a first bias voltage higher than a voltage on the first voltage bus VDD. The second drive apparatus 806 is configured to provide a second bias voltage higher than the voltage on the first voltage bus VDD. The auxiliary drive, apparatus 808 is configured to provide a third bias voltage higher than the voltage on the first voltage bus VDD. The auxiliary drive apparatus 808 comprises a leakage current path.

The operating principle of the second inverter 620 shown in FIG. 8 is similar to that of the first inverter 610 shown in FIG. 7 except that one more drive apparatus is employed to further enhance the drive capability of the second inverter 620. As such, the second inverter 620 is able to achieve both high efficiency and better switching performance.

Although embodiments of the present disclosure and its advantages have been described in detail, it should be understood that various changes, substitutions and alterations can be made herein without departing from the spirit and scope of the invention as defined by the appended claims.

What is claimed is:

1. A voltage converter circuit comprising a depletion transistor and a resistive element for limiting a leakage current in the circuit and for supplying a turn-on current to a switch, the depletion transistor having a pinch-off voltage, and the resistive element coupled between a gate of the switch and the depletion transistor, wherein a first terminal of the resistive element is connected to a drain/source terminal of the depletion transistor, and a second terminal of the resistive element is connected to a gate terminal of the depletion transistor, and wherein a voltage across the resistive element generates a negative voltage between the gate terminal and the drain/source terminal of the depletion transistor.

2. The voltage converter circuit of claim 1, in which the resistive element and the depletion transistor are used for limiting the leakage current in the circuit and for supplying the turn-on current to the switch, the resistive element having a resistance value.

3. The voltage converter circuit of claim 1, in which the leakage current flows from one voltage rail to another voltage rail.

4. The voltage converter circuit of claim 1, in which the switch is a transistor.

5. The voltage converter circuit of claim 1, in which the leakage current is a function of the pinch-off voltage of the depletion transistor.

6. The voltage converter circuit of claim 1, in which the turn-on current is a function of the pinch-off voltage of the depletion transistor.

7. The voltage converter circuit of claim 1, in which the leakage current is a function of the pinch-off voltage of the depletion transistor and a resistance of the resistive element.

8. The voltage converter circuit of claim 1, in which the turn-on current is a function of the pinch-off voltage of the depletion transistor.

9. The voltage converter circuit of claim 1, in which the depletion transistor has a source terminal connected to the resistive element.

10. The voltage converter circuit of claim 9, in which the depletion transistor is configured to be pinched off by the voltage across the resistive element.

11. A process for limiting a leakage current in a voltage converter circuit, comprising:

flowing a current on a current path from a first voltage rail to a second voltage rail in response to a high input signal, wherein the current path comprises a depletion transistor and a resistive element; and applying a pinch-off voltage to the depletion transistor to limit the current on the current path, wherein the pinch-off voltage is a voltage across the resistive element, and the voltage across the resistive element generates a negative voltage between a gate terminal and a source terminal of the depletion transistor.

12. The process of claim 11, in which the limited current is a function of the resistive element connected to the depletion transistor.

13. The process of claim 12, in which the resistive element is connected to the gate terminal of the depletion transistor.

14. The process of claim 12, in which the resistive element is further connected to the source terminal of the depletion transistor.

15. The process of claim 12, in which the depletion transistor is biased by the voltage across the resistive element.

16. A process of driving a switch in a voltage converter, comprising:

flowing a current on a current path to a switch in response to a low input signal, wherein the current path comprises a depletion transistor and a resistive element, and wherein a first terminal of the resistive element is connected to a drain/source terminal of the depletion transistor, and a second terminal of the resistive element is connected to a gate terminal of the depletion transistor, and wherein a voltage across the resistive element generates a negative voltage between the gate terminal and the drain/source terminal of the depletion transistor; and limiting the amount of the current to a pinched-off current of the depletion transistor in the current path.

17. The process of claim 16, in which the current is a function of a voltage across the resistive element in the current path.

18. The process of claim 17, in which the resistive element is connected to the gate terminal of the depletion transistor.

19. The process of claim 18, in which the drain/source terminal is a source terminal of the depletion transistor.

20. The process of claim 19, in which the depletion transistor is biased by a voltage across the resistive element.

\* \* \* \* \*